US 8,518,283 B2

(12) United States Patent
Yamamoto et al.

(10) Patent No.: US 8,518,283 B2
(45) Date of Patent: Aug. 27, 2013

(54) PLASMA ETCHING METHOD CAPABLE OF DETECTING END POINT AND PLASMA ETCHING DEVICE THEREFOR

(75) Inventors: Takashi Yamamoto, Amagasaki (JP); Masahiko Tanaka, Amagasaki (JP); Yoshiyuki Nozawa, Amagasaki (JP); Shoichi Murakami, Amagasaki (JP)

(73) Assignee: SPP Technologies Co., Ltd., Tokyo (JP)

( * ) Notice: Subject to any disclaimer, the term of this patent is extended or adjusted under 35 U.S.C. 154(b) by 1184 days.

(21) Appl. No.: 12/089,474

(22) PCT Filed: Jul. 27, 2007

(86) PCT No.: PCT/JP2007/064748
§ 371 (c)(1),
(2), (4) Date: Apr. 7, 2008

(87) PCT Pub. No.: WO2008/013256
PCT Pub. Date: Jan. 31, 2008

(65) Prior Publication Data
US 2009/0277872 A1 Nov. 12, 2009

(30) Foreign Application Priority Data

Jul. 28, 2006 (JP) ................. 2006-205764
Feb. 16, 2007 (JP) ................. 2007-036204

(51) Int. Cl.
*G01R 31/00* (2006.01)
(52) U.S. Cl.
USPC ............ 216/60; 216/37; 216/58; 216/67; 216/74; 216/79; 438/689; 438/706; 438/710; 438/719

(58) Field of Classification Search
USPC ........ 216/37, 58, 59, 60, 67, 74, 79; 438/689, 438/706, 710, 719
See application file for complete search history.

(56) References Cited

U.S. PATENT DOCUMENTS

| 5,871,658 | A  | * | 2/1999 | Tao et al. ................. 216/60 |
| 6,187,685 | B1 | * | 2/2001 | Hopkins et al. ............ 438/710 |
| 6,270,634 | B1 | * | 8/2001 | Kumar et al. ............ 204/192.37 |

(Continued)

FOREIGN PATENT DOCUMENTS

| JP | 59-79528 A | 5/1984 |
| JP | 2002-270574 A | 9/2002 |

(Continued)

OTHER PUBLICATIONS

International Search Report of PCT/JP2007/064748, date of mailing Aug. 21, 2007.
European Search Report dated Sep. 30, 2010, issued in corresponding European Patent Application No. 07791442.2.

*Primary Examiner* — Nadine Norton
*Assistant Examiner* — Christopher Remavege
(74) *Attorney, Agent, or Firm* — Westerman, Hattori, Daniels & Adrian, LLP

(57) ABSTRACT

The present invention relates to a plasma etching method in which a special area for detecting an end point needs not to be set and an equipment therefor. At an etching step of forming $SF_6$ gas into plasma to etch an etching ground on a Si film, the step is configured by two steps of: a large-amount supply step of supplying a large amount of $SF_6$ gas; and a small-amount supply step of supplying a small amount of $SF_6$ gas. An end-point detecting processor 34 measures an emission intensity of Si or SiFx in the plasma at the small-amount supply step, and determines that an etching end point is reached when the measured emission intensity becomes equal to or less than a previously set reference value.

9 Claims, 12 Drawing Sheets

(56) References Cited

U.S. PATENT DOCUMENTS

| | | | |
|---|---|---|---|
| 6,787,054 B2 * | 9/2004 | Wang et al. | 216/72 |
| 6,911,157 B2 * | 6/2005 | Edamura et al. | 216/59 |
| 6,982,175 B2 * | 1/2006 | Johnson et al. | 438/9 |
| 7,427,519 B2 * | 9/2008 | Lee | 438/9 |
| 2004/0238489 A1 | 12/2004 | Johnson et al. | |
| 2005/0130436 A1 | 6/2005 | Nozawa et al. | |

FOREIGN PATENT DOCUMENTS

| | | | |
|---|---|---|---|
| JP | 2003-92286 A | | 3/2003 |
| JP | 2003092286 | * | 3/2003 |
| JP | 2004-31970 A | | 1/2004 |
| JP | 2005-303130 A | | 10/2005 |
| WO | 2004/030050 A2 | | 4/2004 |
| WO | 2004/102642 A2 | | 11/2004 |

* cited by examiner (a)

(b)

(c)

(d)

(e)

(f)

(a)

(b)

(c)

(d)

(e)

(f)

(a)

(b)

(c)

(d)

(e)

(f)

| Flow rate (sccm) | Ratios of emission intensity level of SiF | | |
|---|---|---|---|
| | Si/Polyimide | Si/Photoresist | Si/Polyester |
| 800 | 1.2 | 1.2 | 1.1 |
| 600 | 1.2 | 1.2 | 1.0 |
| 400 | 1.2 | 1.2 | 1.1 |
| 200 | 2.4 | 2.5 | 2.2 |
| 100 | 6.4 | 7.7 | 5.3 |
| 50 | 4.4 | 6.2 | 3.6 |

| Flow rate (sccm) | Ratios of emission intensity level of F | | |
|---|---|---|---|
| | Si/Polyimide | Si/Photoresist | Si/Polyester |
| 800 | 1.0 | 1.1 | 1.1 |
| 600 | 1.0 | 1.1 | 1.1 |
| 400 | 1.0 | 1.1 | 1.0 |
| 200 | 0.9 | 0.9 | 0.9 |
| 100 | 0.6 | 0.6 | 0.6 |
| 50 | 0.4 | 0.4 | 0.4 |

PLASMA ETCHING METHOD CAPABLE OF DETECTING END POINT AND PLASMA ETCHING DEVICE THEREFOR

TECHNICAL FIELD

The present invention relates to a plasma etching method for forming etching gas into plasma to etch a Si film and an equipment therefor, and relates to a plasma etching method capable of surely detecting an etching end point and an equipment therefor.

BACKGROUND ART

As a method for detecting an end point of etching in plasma etching, conventionally, it is known that which is disclosed in Patent Document 1.

In this end-point detection method, a silicon substrate is formed thereon with a mask in which a plurality of etching end-point detection patterns formed of an aperture area and a mask area are drawn, the plurality of etching end-point detection patterns are irradiated with a laser beam, an interference intensity which is generated from an optical path difference of two optical paths in the aperture area and the mask area in each detection pattern and which corresponds to an etching depth is monitored, a change amount of the etching depth, i.e., an etching rate, is calculated based on the monitored interference intensity, and from the calculated etching rate and a lapsed time, an etching end point is detected.

[Patent Document 1] Japanese Unexamined Patent Publication No. 2005-38896

DISCLOSURE OF INVENTION

Problem Invention is to Solve

However, in the above-described conventional end-point detection method, since it is necessary that besides an area for forming a device, an area for a plurality of etching end-point detection patterns is set on the silicon substrate. Thus, a number of devices which can be manufactured from one silicon substrate is decreased by an amount that the etching end-point detection patterns are arranged, i.e., a device integration is poor, and this arises a problem in that an effective manufacturing is not possible.

It is also necessary that a laser beam oscillating device for irradiating a laser beam and an image monitoring camera for receiving reflection light are arranged directly above the silicon substrate, and thus, there is a problem in that an equipment configuration is greatly restricted.

The present invention has been achieved in view of the above-described circumstances, and an object thereof is to provide a plasma etching method capable of detecting an end point in which a special area for detecting an etching end point needs not to be arranged on a silicon substrate and an equipment configuration is restricted minimally, and a plasma etching equipment therefor.

Means for Resolving the Problem

To solve the above-described problems, the present invention relates to a plasma etching method capable of detecting an end point in which a Si film of a silicon substrate including the Si film formed on a surface side and a lower layer film formed below the Si film is etched, the plasma etching method for etching the Si film by supplying etching gas containing $SF_6$ gas so that plasma is formed, wherein at least two steps of a large-amount supply step of supplying a large amount of $SF_6$ gas for processing the silicon substrate and a small-amount supply step at which a supply amount is reduced to supply a small amount of $SF_6$ gas for processing the silicon substrate are repeatedly implemented, an emission intensity of Si or SiFx in the plasma at the small-amount supply step is measured, and when the measured emission intensity becomes equal to or less than a previously set reference value, a process is ended, determining that an etching end point is reached.

The present invention relates to a plasma etching equipment, comprising: an etching chamber which houses a silicon substrate including a Si film formed on a surface side and a lower layer film formed below the Si film;

a platen on which the silicon substrate is mounted, the platen being arranged at a lower position in an interior of the etching chamber;

an etching-gas supply section for supplying etching gas containing $SF_6$ gas to the interior of the etching chamber;

a depressurizing section for depressurizing the interior of the etching chamber;

a plasma generating section applying high frequency power to a coil to form the gas in the interior of the etching chamber into plasma, the plasma generating section including the coil wired at an outer periphery of the etching chamber in a manner to face the etching chamber;

a platen power-applying section for applying high frequency power to the platen; and a controlling device for controlling operations of the etching-gas supply section, the plasma generating section, and the platen power-applying section such that an etching step at which the etching gas is supplied to the interior of the etching chamber, the high frequency power is applied to the coil, and the high frequency power is applied to the platen is implemented, the plasma etching equipment, comprising:

an emission intensity detector for detecting an emission intensity of the plasma in the interior of the etching chamber; and an etching-end-point detecting section for detecting an end point of etching based on emission intensity data detected by the emission intensity detector, wherein the controlling device is configured to control an operation of the etching-gas supply section such that at the etching step, at least two steps of a large-amount supply step of supplying a large amount of $SF_6$ gas for processing the silicon substrate and a small-amount supply step at which a supply amount is reduced to supply a small amount of $SF_6$ gas for processing the silicon substrate are repeatedly implemented, and to receive an end-point detection signal from the etching-end-point detecting section to end a series of processes, and the etching-end-point detecting section is configured to extract an emission intensity of Si or SiFx in the plasma at the small-amount supply step and to transmit the end-point detection signal to the controlling device, determining that an etching end point is reached when the extracted emission intensity becomes equal to or less than a previously set reference value.

As described above, the present invention relates to a plasma etching method for etching a Si film of a silicon substrate including the Si film formed on a surface side and a lower layer film formed below the Si film and a plasma etching equipment therefor. The Si film is etched by using etching gas containing $SF_6$ gas.

The etching step is configured by at least two steps of a large-amount supply step of supplying a large amount of $SF_6$ gas for processing the silicon substrate and a small-amount supply step at which a supply amount is reduced to supply a small amount of $SF_6$ gas for processing the silicon substrate.

For the lower layer film, those which are more difficult to etch as compared to the Si film such as a $SiO_2$ film, a film formed by a polyimide tape, a film formed by photoresist, a film formed by grease, a film formed by wax, a film formed by a sheet with a thermal stripping material (a polyester film or the like), a silicon nitride film, or the like, may be included, for example. The lower layer film, however, is not particularly limited thereto.

As a result of studies by the present inventors, it was revealed that under the condition that a large amount of $SF_6$ gas was supplied and formed into plasma, emission intensities of fluorinated silicon (SiFx) species such as Si, SiF, $SiF_2$ or the like in the plasma did not differ greatly between the case where the Si film only existed and the case where the lower layer film only existed; on the other hand, under the condition that a small amount of $SF_6$ gas was supplied and formed into plasma, the emission intensities of Si and SiFx greatly differed between the case where the Si film only existed and the case where the lower layer film only existed.

That is, under the condition that a large amount of $SF_6$ gas is supplied and formed into plasma, the emission intensities of Si and SiFx in the plasma are at a low level in both cases where the Si film only exists and where the lower layer film only exists. On the other hand, under the condition that a small amount of $SF_6$ gas is supplied and formed in plasma, the emission intensities of Si and SiFx are at a high level when the Si film only exists but are at a low level when the lower layer film only exists.

The reason why the emission intensity changes depending on a supply flow rate of $SF_6$ gas when the Si film only exists is probably because when the supply flow rate of $SF_6$ gas is large, an exhaust flow rate exhausted from the interior of the etching chamber which is controlled to a setting pressure is also large, and thus, Si or SiFx generated by re-dissociation of $SiF_4$ generated by etching is exhausted immediately after the generation, and as a result, an amount of Si or SiFx existing in the interior of the etching chamber becomes small; on the other hand, when the supply flow rate of the $SF_6$ gas is small, the exhaust flow rate exhausted from the interior of the etching chamber which is controlled to a setting pressure is also small, and thus, the generated Si and SiFx can easily remain in the interior of the etching chamber, and as a result, the amount of Si and SiFx which exist in the interior of the etching chamber becomes large.

In contrary, the reason why the emission intensity does not change greatly depending on the supply flow rate of $SF_6$ gas when the lower layer film only exists is probably because Si and SiFx do not exist in the interior of the etching chamber or if Si and SiFx exist, an amount thereof is extremely small. Alternatively, probably due to a change in emission intensity resulting from an influence of peripheral wavelengths, a change in plasma density, or the like, a change, if at a low level, is found in an emission intensity of a wavelength which corresponds to Si or SiFx.

Therefore, in the small-amount supply step, the emission intensity of Si or SiFx in the plasma is measured and when the measured emission intensity becomes equal to or less than a previously set reference value, it is possible to determine that the lower layer film is exposed, that is, the etching end point is reached.

Thus, in the present invention, as described above, the etching step is configured by at least two steps, i.e., the large-amount supply step of supplying a large amount of $SF_6$ gas for the processing the silicon substrate and the small-amount supply step of supplying a small amount of $SF_6$ gas for processing the silicon substrate. Thereby, at the large-amount supply step, a high-speed etching in which an etching rate is increased can be realized, and at the small-amount supply step, an etching end point can be surely detected although the etching rate is low. As a result, the etching end point can be surely detected while realizing overall high-speed etching.

Further, unlike in the conventional art, there is no need of arranging on a silicon substrate an area for a plurality of etching end-point detection patterns in addition to an area for forming a device. This can enhance a device integration and permit an effective manufacturing.

Further, there is a merit in that an emission intensity detector for measuring an emission intensity of a specific substance in the plasma can be arranged at an arbitrary position in the etching chamber, and thus, an equipment configuration is minimally restricted.

At least two steps, i.e., the large-amount supply step and the small-amount supply step may be repeatedly implemented from a start of the process. However, the present invention is not limited thereto. It may be possible that the large-amount supply step is implemented for a previously determined period, and thereafter, at least the two steps, i.e., the large-amount supply step and the small-amount supply step is implemented from a point at which it is determined that the etching end point is within reach.

As described above, when supplying a large amount of $SF_6$ gas for processing the silicon substrate, the etching rate is high, and when the supply amount is small, the etching rate is low. Therefore, when the small-amount supply step is implemented from the start of the process, in view of the etching speed, it is not possible to say that this implementation is always the most appropriate.

Therefore, as described above, the etching step of supplying a large amount of $SF_6$ gas is implemented until it is determined that the etching end point is within reach, and thereafter, at least the two steps, i.e., the large-amount supply step and the small-amount supply step are repeatedly implemented. Thereby, a decrease of etching speed caused by implementing the small-amount supply step can be minimized, and reliable detection of the etching end point can be enabled in a state where an overall etching speed is made faster, hence effective.

A substance to be extracted, from which the emission intensity is extracted by the etching-end-point detecting section, is not limited to the above-described Si or SiFx. The emission intensity of F may be extracted. It is revealed that as a result of studies by the present inventors, under the condition that a large amount of $SF_6$ gas is supplied and formed in plasma, the emission intensity of F in the plasma remains at a high level in both cases where the Si film only exists and where the lower layer film only exits; and on the other hand, under the condition that a small amount of $SF_6$ gas is supplied and formed in plasma, the emission intensity of F is at a low level when the Si film only exists but that of F becomes a high level when the lower layer film only exists.

The reason why the emission intensity changes depending on a supply flow rate of $SF_6$ gas in the case where the Si film only exists is probably because although F is generated by forming the $SF_6$ gas into plasma, when the supply flow rate of $SF_6$ gas is large, a ratio of $SiF_4$ which is an etching product, or Si or SiFx which is a dissociated species of $SiF_4$ is low, and when the supply flow rate of $SF_6$ gas is small, the ratio of $SiF_4$ which is an etching product, or Si or SiFx which is a dissociated species of $SiF_4$ becomes high, and as a result, when the supply flow rate of $SF_6$ gas is less, a ratio of F which exists in the interior of the etching room $2a$ becomes low.

On the other hand, the reason why the emission intensity does not change greatly depending on the supply flow rate of $SF_6$ gas when the lower layer film only exists is probably because the amount of F which exists in the interior of the etching chamber does not change greatly since the amount of the generated F is not spent for the etching or even if it is spent, the amount thereof is extremely small.

Therefore, in this case, the etching-end-point detecting section determines that the etching end point is reached when the extracted (measured) emission intensity of F becomes equal to or more than the previously set reference value.

The present invention can also be applied to a plasma etching method for etching the Si film by repeatedly implementing: an etching step of etching the Si film by supplying etching gas containing $SF_6$ gas so that the gas is formed in plasma; and a passivation-layer forming step of forming a passivation-layer on a structural surface formed at the etching step by supplying passivation-layer forming gas containing fluorocarbon (CxFy) gas such as $CF_4$ gas, $C_3F_8$ gas, $C_4F_8$ gas, $C_5F_8$ gas or the like, or $O_2$ gas so that plasma is formed.

In this case also, the etching step may be implemented by dividing into at least two steps, i.e., the large-amount supply step and the small-amount supply step, from the start of the process, but is not limited thereto. However, it may be possible that after the etching step of supplying a large amount of $SF_6$ gas and the passivation-layer forming step are repeated for a previously determined number of times, the etching step may be implemented by dividing into two steps, i.e., the large-amount supply step and the small-amount supply step, from a point at which it is determined that the etching end point is within reach.

According to the knowledge obtained by the present inventors, it is preferable that under the control of the controlling device, a supply amount of $SF_6$ gas supplied by the etching-gas supply section at the small-amount supply step be 180 sccm or less. In the case of 180 sccm or less, a significant difference is found in emission intensity of Si, SiFx, or F.

It is further preferable that under the control of the controlling device, the supply amount of $SF_6$ gas supplied by the etching-gas supply section at the large-amount supply step be 200 sccm or more in view of an etching speed, and more preferable that it be 400 sccm or more.

Effects of the Invention

As described above, according to the present invention, a whole or a part of the etching step is configured by at least two steps, i.e., a large-amount supply step of supplying a large amount of $SF_6$ gas for processing the silicon substrate and a small-amount supply step of supplying a small amount of $SF_6$ gas for processing the silicon substrate. At the large-amount supply step, a high-speed etching in which an etching rate is increased can be realized, and in the small-amount supply step, an etching end point can be surely detected although the etching rate is low. As a result, the etching end point can be surely detected while realizing overall high-speed etching.

Further, unlike in the conventional art, there is no need of arranging on a silicon substrate an area for a plurality of etching end-point detection patterns besides an area for forming a device. Thus, a device integration can be enhanced, and an effective manufacturing can be performed.

Further, there is a merit in that an emission intensity detector for measuring an emission intensity of a specific substance in a plasma can be arranged at an arbitrary position in an etching chamber, and thus, an equipment configuration is minimally restricted.

BRIEF DESCRIPTION OF THE DRAWINGS

FIG. 13 is a table showing Si/polyimide ratios of an emission intensity level of F, Si/photoresist ratios thereof, and Si/polyester ratios thereof by each supply flow rate of $SF_6$ gas in the case where the lower layer film is formed of polyimide, photoresist, or polyester.

LEGEND

Figure 1:
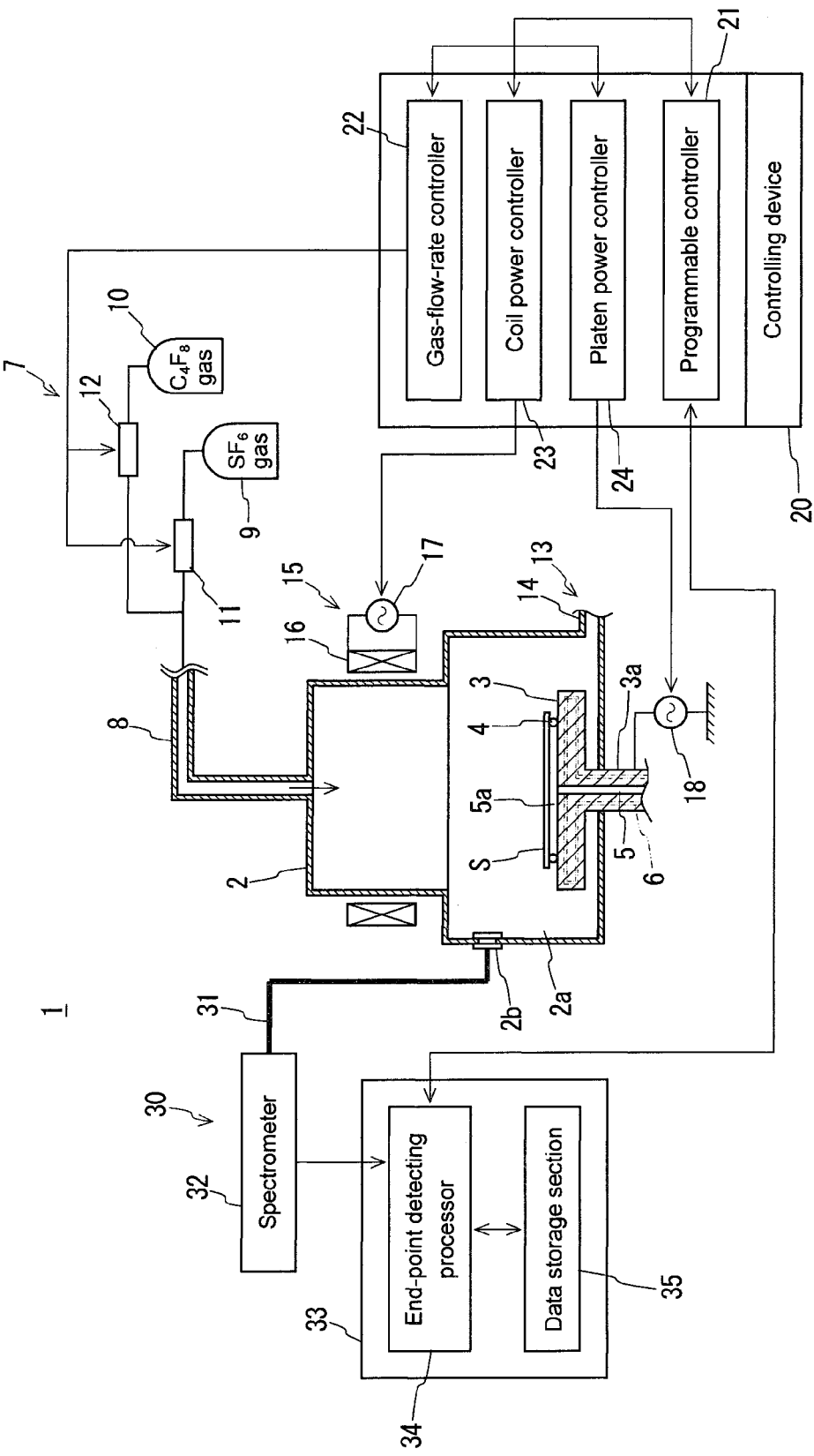
FIG. 1 is a cross-sectional view showing a schematic configuration of an etching equipment according to one embodiment of the present invention, in which a part of the schematic configuration is shown in a block diagram.

1 Plasma etching equipment
2 Etching chamber
3 Platen
7 Gas supply section
13 Depressurizing section
15 Plasma generating section
18 High-frequency power source
20 Controlling device
21 Programmable controller
22 Gas-flow-rate controller
23 Coil power controller
24 Platen power controller
30 End-point detection device
32 Spectrometer
34 End-point detecting processor
S Silicon substrate

BEST MODE FOR CARRYING OUT THE INVENTION

With reference to accompanying drawings, specific embodiments of the present invention will be described below. FIG. 1 is a cross-sectional view showing a schematic configuration of a plasma etching equipment according to the embodiment, in which a part of the schematic configuration is shown in a block diagram.

As shown in FIG. 1, a plasma etching equipment 1 is provided with: a case-shaped etching chamber 2 formed therein with an etching room 2a; a platen 3 arranged in a lower area in the etching room 2a and on which a silicon substrate S, which is an object to be etched, is mounted; a gas supply section 7 for supplying $SF_6$ gas which is etching gas and $C_4F_8$ gas which is passivation-layer forming gas to an interior of the etching room 2a; a depressurizing section 13 for depressurizing the interior of the etching room 2a; a plasma generating section 15 for forming the $SF_6$ gas and the $C_4F_8$ gas supplied to the interior of the etching room 2a into plasma; a high-frequency power source 18 for applying high-frequency power to the platen 3; a controlling device 20 for controlling operations of these sections; and an end-point detection device 30 for detecting an end point of etching.

The etching chamber 2 is formed of ceramic. A side wall section of the etching chamber 2 is provided with a sight glass 2b made of a transparent body such as quartz glass or the like, and through the sight glass 2b, the interior of the etching room 2a can be monitored from outside.

On the platen 3, the silicon substrate S is mounted via a sealing member such as an O-ring 4. The platen 3 is configured such that: its base 3a is led externally of the etching room 2a; its center portion is formed with a communication passageway 5 which passes through to a space 5a formed between the platen 3 and the silicon substrate S; and through the communication passageway 5, helium gas is filled and sealed in an interior of the space 5a. The platen 3 is formed with a cooling-water circuit 6. By means of cooling water (20° C.) which circulates in the interior of the cooling-water circuit 6, the silicon substrate S is cooled via the platen 3 and the helium gas. The platen 3 is applied high-frequency power of 13.56 MHz by the high-frequency power source 18, and thereby, a bias potential is generated on the platen 3 and the silicon substrate S mounted on the platen 3.

The gas supply section 7 is formed by: a gas supply pipe 8 connected to an upper end of the etching chamber 2; and gas cylinders 9 and 10 each connected via mass flow controllers 11 and 12 to the gas supply pipe 8. Gas of which a flow rate is adjusted by the mass flow controllers 11 and 12 is supplied from the gas cylinders 9 and 10 to the interior of the etching room 2a. The $SF_6$ gas is filled in the gas cylinder 9, and the $C_4F_8$ gas is filled in the gas cylinder 10. For passivation-layer forming gas, other fluorocarbon (CxFy) gases such as $CF_4$, $C_3F_8$, $C_5F_8$ or the like, or $O_2$ gas may be used in addition to the gases mentioned above.

The depressurizing section 13 is formed by an exhaust pipe 14 connected to a lower end of the etching chamber 2 and a vacuum pump (not shown) connected to the exhaust pipe 14. By means of the vacuum pump (not shown), gas in the etching room 2a is exhausted, and as a result, the interior of the etching room 2a is depressurized to a predetermined low pressure (3 Pa to 30 Pa, for example).

The plasma generating section 15 is formed by: a coil 16 wired along an outer periphery which is above the platen 3 of the etching chamber 2; and a high-frequency power source 17 for applying high-frequency power of 13.56 MHz to the coil 16. When the high-frequency power is applied to the coil 16, a variable magnetic field is formed in a space in the etching room 2a, and the gas supplied to the interior of the etching room 2a is converted into plasma by an electric field induced by the variable magnetic field.

Figure 6:
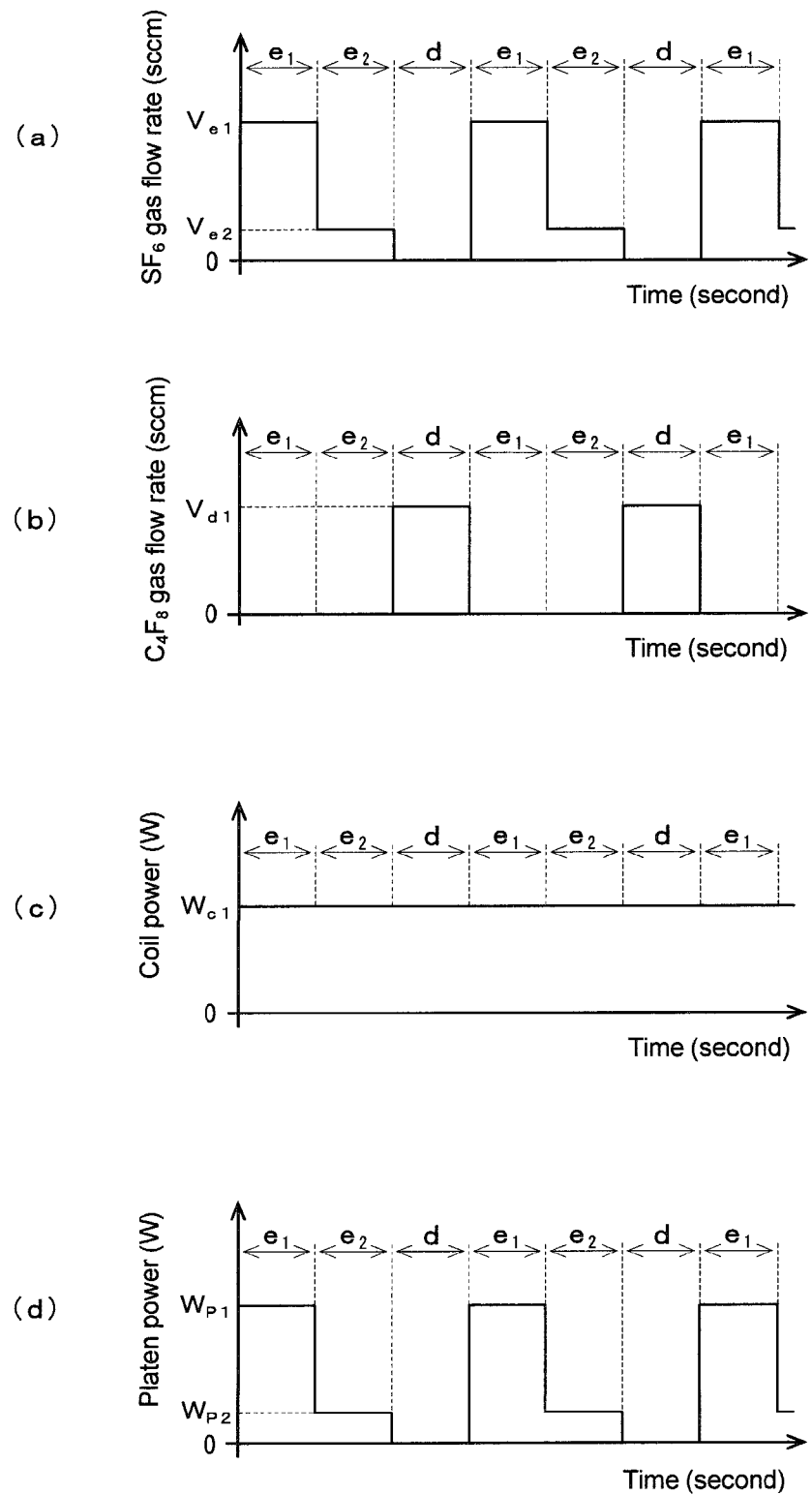
FIGS. 6(a) to 6(d) are timing charts showing: a control state of a flow rate of $SF_6$ gas; that of $C_4F_8$ gas; that of high frequency power applied to a coil; and that applied to a platen in the embodiment.

The controlling device 20 is configured by: a gas-flow-rate controller 22 for controlling the mass flow controllers 11 and 12 and for adjusting flow rates of gas supplied from the gas cylinders 9 and 10 to the interior of the etching room 2a as in a manner shown in FIGS. 6(a) and 6(b); a coil power controller 23 for controlling the high frequency power applied to the coil 16 as in a manner shown in FIG. 6(c); a platen power controller 24 for controlling the high frequency power applied to the platen 3 as in a manner shown in FIG. 6(d); and a programmable controller 21 which transmits a control signal to each of the gas-flow-rate controller 22, the coil power controller 23, and the platen power controller 24 so that each of these components is caused to execute the above-described control.

The end-point detection device 30 is configured by: an optical fiber 31 of which one end faces the sight window 2b and which is arranged to receive light of the interior of the etching room 2a from the one end; a spectrometer 32, connected to the other end of the optical fiber 31, for detecting an emission intensity of the light received by the optical fiber 31; and a processing device 33 which receives emission intensity data detected by the spectrometer 32 to detect the end point of etching based on the emission intensity data.

Figure 2:
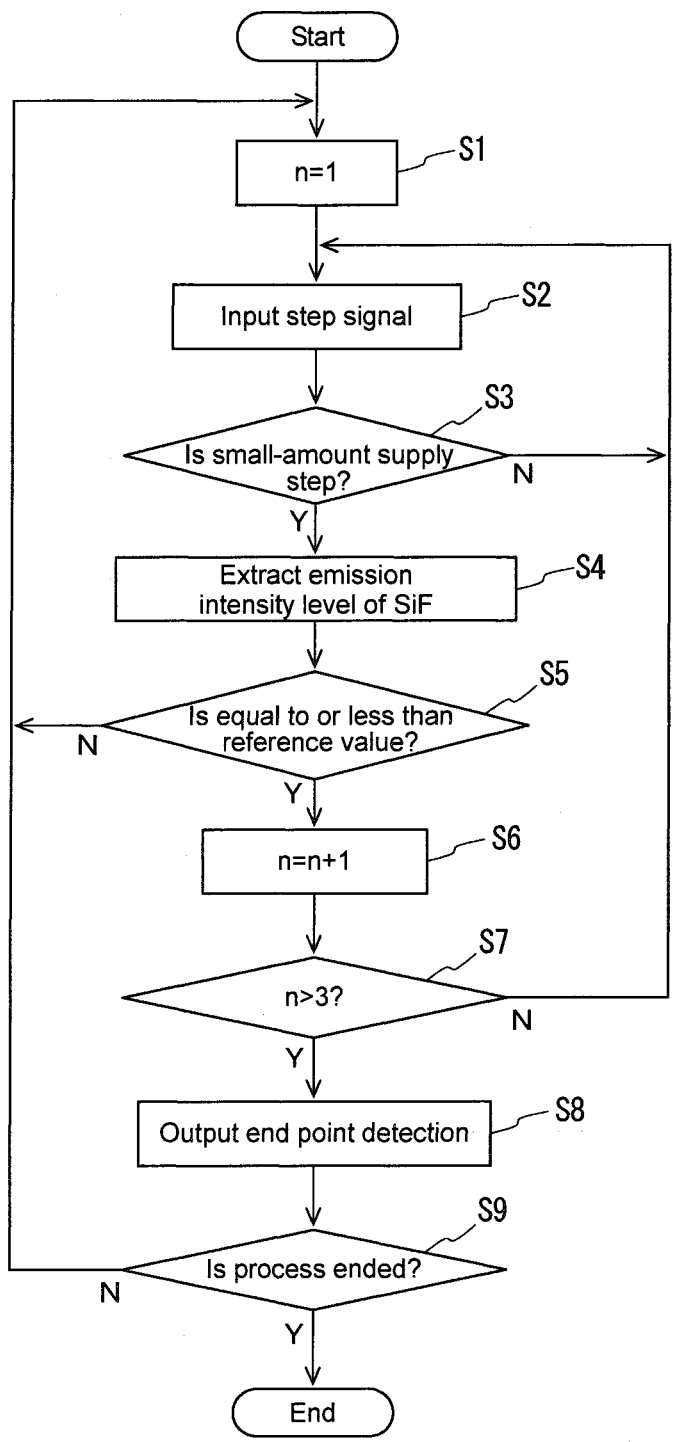
FIG. 2 is a flowchart showing a process procedure in an end-point detecting processor according to the embodiment.

The processing device 33 is further configured by: an end-point detecting processor 34 which performs a process shown in FIG. 2 based on the emission intensity data detected by the spectrometer 32 to detect the end point of etching and transmits a detection signal to the controlling device 20; and a data storage section 35 for storing a reference value used for detecting the end point. To the end-point detecting processor 34, an etching-process start signal or a step signal (a signal which indicates what steps are executed, i.e., whether current processing is an etching step or a passivation-layer forming step, and so on) is transmitted from the controlling device 20.

Subsequently, an operation of the plasma etching equipment 1 provided with the above-described configuration will be described.

Firstly, a description is given of a mode for etching the silicon substrate S. In the following description, the description is made such that for the silicon substrate S, that which is formed with a Si film on a $SiO_2$ film, which is an insulating film, is used as one example.

On the Si film of the silicon substrate S, an etching mask (a resist film or the like, for example) in a desired shape is firstly formed using photolithography or the like, and thereafter, the silicon substrate S is placed into the etching chamber 2 and mounted on the platen 3 via the O-ring 4. Thereafter, the helium gas is filled in the space 5a from the communication passageway 5, and the helium gas is sealed therein. The cooling water in the interior of the cooling-water circuit 6 is always circulated.

When a processing preparation is thus complete, the programmable controller 21 starts a process according to a program previously created, and transmits the controls signal to each of the gas-flow-rate controller 22, the coil power controller 23, and the platen power controller 24. Under the control of the gas-flow-rate controller 22, the coil power controller 23, and the platen power controller 24, the programmable controller 21 supplies the $SF_6$ gas and the $C_4F_8$ gas to the interior of the etching room 2a from the gas cylinders 9 and 10, and applies the high frequency power to the coil 16 and applies the high frequency power to the platen 3.

The flow rate of the $SF_6$ gas supplied to the interior of the etching room 2a is controlled by the gas-flow-rate controller 22 to change successively by three stages, i.e., $V_{e1}$ sccm, $V_{e2}$ sccm, and 0 sccm, as shown in FIG. 6(a). It is noted that a step at which the flow rate is $V_{e1}$ sccm is referred to as a large-amount supply step $e_1$; a step at which the flow rate is $V_{e2}$ sccm is referred to as a small-amount supply step $e_2$; and a step at which the flow rate is 0 sccm is referred to as a passivation-layer forming step d. Two steps, i.e., the large-amount supply step $e_1$ and the small-amount supply step $e_2$, configure an etching step.

The flow rate of the $C_4F_8$ gas is controlled by the gas-flow-rate controller 22 to become 0 sccm at the large-amount supply step $e_1$ and the small-amount supply step $e_2$ and to become $V_{d1}$ sccm in the passivation-layer forming step d, as shown in FIG. 6(b).

The high frequency power applied to the coil 16 is controlled by the coil power controller 23 to maintain $W_{c1}W$ from a start of the process to an end thereof, as shown in FIG. 6(c). The high frequency power applied to the platen 3 is controlled by the platen power controller 24 to become $W_{p1}W$ at the large-amount supply step $e_1$, to become $W_{p2}W$ in the small-amount supply step $e_2$, and to become 0 W in the passivation-layer forming step d, as shown in FIG. 6(d).

The $SF_6$ gas supplied to the interior of the etching room 2a is converted into plasma which includes an ion, an electron, an F radical or the like in the variable electric field generated by the coil 16. The plasma is kept at high density by an effect of the variable electric field. The F radicals which exist in the plasma chemically react with Si to function to remove Si from the silicon substrate S, that is, to function to etch the silicon substrate S. The ions are accelerated toward the platen 3 and the silicon substrate S by a self-bias potential generated in the platen 3 and the silicon substrate S, and the accelerated ions strike the silicon substrate S, thereby etching the silicon substrate S. Thus, a Si-film surface of a mask aperture is etched by the F radicals and the ions, and thereby, a groove or a hole of a predetermined width and depth is formed.

When the flow rate of the supplied $SF_6$ gas is greater, an etching speed (rate) is increased. At the large-amount supply step $e_1$ at which the flow rate is large, i.e., $V_{e1}$ sccm, the etching speed is high, and in the small-amount supply step $e_2$ at which the flow rate is small, i.e., $V_{e2}$ sccm, the etching speed is lower than the above-described speed.

On the other hand, the $C_4F_8$ gas forms a polymer in the plasma, and the polymer is deposited on a side surface and a bottom surface (an etching surface) of the groove or the hole, which functions to form a fluorocarbon film. The fluorocarbon film does not react with the F radial, and thus, the fluorocarbon film functions as a passivation-layer to the F radial. The passivation-layer prevents side-etching and undercut. As described above, for the passivation-layer forming gas, $O_2$ gas can be used in addition to the fluorocarbon (CxFy) gas. When the $O_2$ gas is used, a $SiO_2$ layer being a passivation-layer is formed on the etching surface.

Thus, when the etching step (the large-amount supply step $e_1$ and the small-amount supply step $e_2$) and the passivation-layer forming step d are successively implemented repeatedly, a predetermined etching shape of which an inner wall surface is vertical can be formed effectively on the silicon substrate S.

Subsequently, a specific mode for detecting the end point of the etching will be described. Prior to that, a principle of an end-point detection is firstly described.

Figure 3:
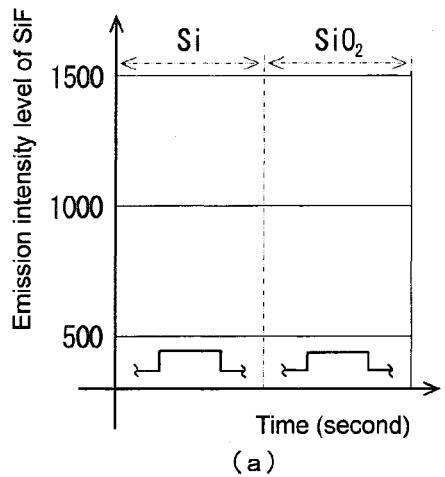
FIGS. 3(a) to 3(f) are explanatory diagrams each showing a characteristic related to an emission intensity of SiF when a lower layer film is a $SiO_2$ film.
Figure 3:
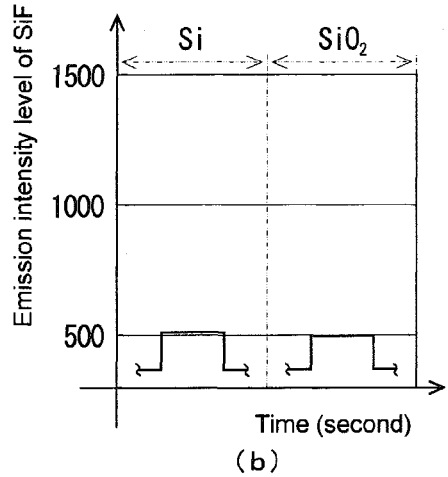
Figure 3:
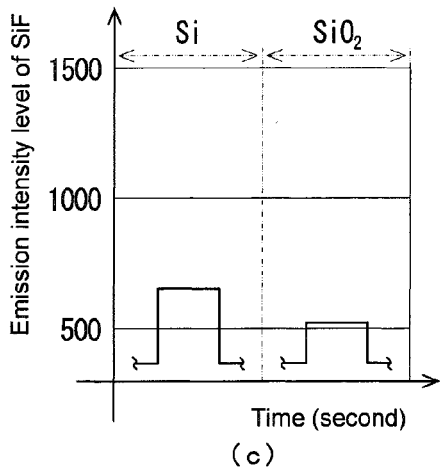
Figure 3:
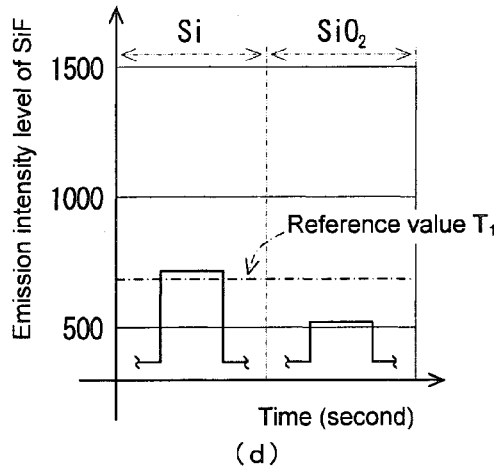
Figure 3:
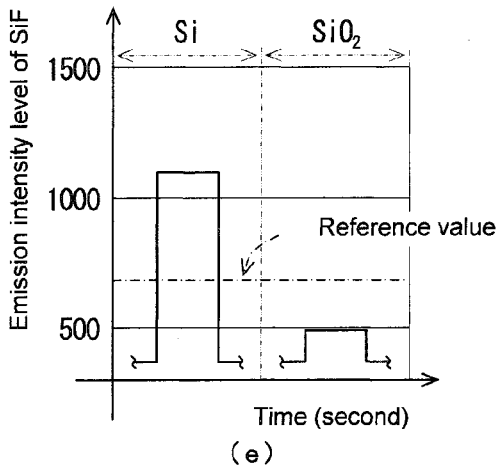
Figure 3:
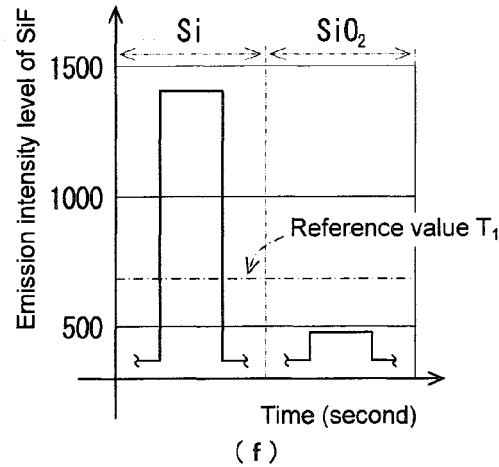

As a result of intensive studies, the present inventors have gained the knowledge that a relationship between an emission intensity of SiF in the plasma and a supply amount of the $SF_6$ gas has a characteristic as shown in FIG. 3.

FIGS. 3(a) to 3(f) show emission intensities of SiF in the case where the Si film (only) exists under a plasma atmosphere and those in the case where the $SiO_2$ film (only) exists under the same condition. FIG. 3(a) shows an emission intensity of SiF in the case where a flow rate of the $SF_6$ gas is 800 sccm; FIG. 3(b) shows that in the case where a flow rate of the $SF_6$ gas is 400 sccm; FIG. 3(c) shows that in the case where a flow rate of the $SF_6$ gas is 200 sccm; FIG. 3(d) shows that in the case where a flow rate of the $SF_6$ gas is 180 sccm; FIG. 3(e) shows that in the case where a flow rate of the $SF_6$ gas is 100 sccm; and FIG. 3(f) shows that in the case where a flow rate of the $SF_6$ gas is 50 sccm. SiF is generated by re-dissociation of $SiF_4$ generated by a reaction between Si, which is to be etched, and the F radial. $SiF_2$, $SiF_3$, or the like are generated in addition to SiF, and all of these fluorinated silicon (SiFx) species exhibit the characteristics shown in FIG. 3.

As understood from FIG. 3, when a large amount of $SF_6$ gas (200 sccm to 800 sccm) is supplied, there is not a large difference in emission intensity level of SiF between the case of the Si film and that of the $SiO_2$ film. However, when only a small amount of $SF_6$ gas (50 sccm to 180 sccm) is supplied, the emission intensity level in the case of the Si film is much higher than that of the case of the $SiO_2$ film.

It is noted that in examples shown in FIGS. 3(a) to 3(f), a $Si/SiO_2$ ratio of the emission intensity level of SiF when the flow rate of the $SF_6$ gas was 180 sccm was about 2.5; a $Si/SiO_2$ ratio of the emission intensity level of SiF when the flow rate of the $SF_6$ gas was 100 sccm was about 6.0; and a $Si/SiO_2$ ratio of the emission intensity level of SiF when the flow rate of the $SF_6$ gas was 50 sccm was about 9.6. Although not particularly illustrated, a $Si/SiO_2$ ratio of the emission intensity level of SiF when the flow rate of the $SF_6$ gas was 30 sccm was about 9.4; and that when the flow rate of the $SF_6$ gas was 15 sccm was about 6.8, respectively.

The reason for such characteristics is probably because when there exists the Si film, if a supply flow rate of the $SF_6$ gas is large, an exhaust flow rate exhausted from the interior of the etching room 2a which is controlled to a setting pressure is also large and SiF is exhausted immediately after SiF is generated, and thus, SiF which exists in the interior of the etching room 2a becomes small; and on the other hand, if the supply flow rate of the $SF_6$ gas is small, the exhaust flow rate exhausted from the interior of the etching room 2a which is controlled to a setting pressure is also small and the generated SiF can easily remain in the interior of the etching room 2a, and thus, SiF which exists in the interior of the etching room 2a becomes large.

On the other hand, probably because when the $SiO_2$ film exists, SiF does not exist or even when SiF exists, only a very small amount of SiF exists in the etching room 2a. Further, probably because due to a change in emission intensity resulting from an influence of peripheral wavelengths, a change in plasma density, or the like, a change, if at a low level, is found in emission intensity of a wavelength which corresponds to SiF.

Therefore, in a state of a small supply amount of the $SF_6$ gas, the emission intensity of SiF in the plasma is measured and when a value thereof becomes equal to or less than a previously defined reference value $T_1$, it is possible to determine that the etching of the Si film is complete and the $SiO_2$ film is exposed, that is, the etching end point is reached.

Figure 4:
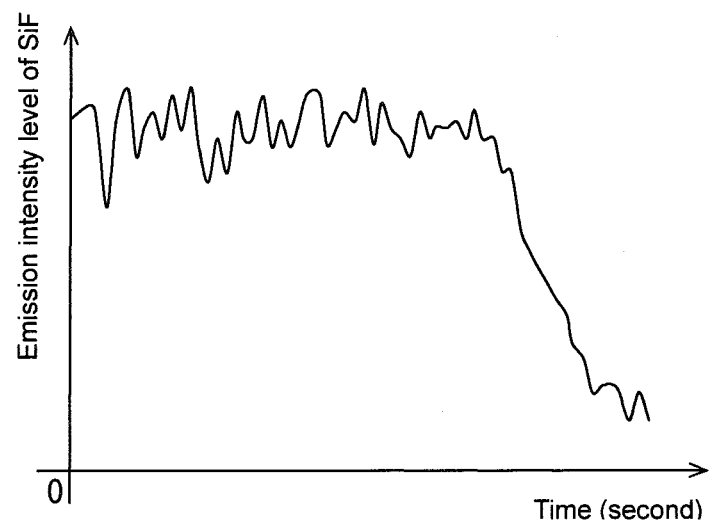
FIG. 4 is a graph showing a relationship between an emission intensity level of SiF and an etching time when $SF_6$ gas is supplied in low flow rate in the case where the lower layer film is the $SiO_2$ film.

FIG. 4 is a graph showing a relationship between the emission intensity level of a wavelength which corresponds to SiF and an etching time when the $SF_6$ gas is supplied to the interior of the etching room 2a at 100 sccm. A certain time is elapsed after the start of the etching and the etching of the Si film is completed, and thus, the $SiO_2$ film is exposed. At this time, the emission intensity level is decreased. As is apparent from FIG. 4, when the emission intensity level is always monitored, the etching end point can be detected.

Therefore, in the embodiment, as described above, the etching step comprised of the two steps, i.e., the large-amount supply step $e_1$ at which a large amount of $SF_6$ gas is supplied and the small-amount supply step $e_2$ at which a small amount of $SF_6$ gas is supplied, is set. At the large-amount supply step $e_1$, a main focus is placed on high-speed etching at a high etching speed (rate), and at the small-amount supply step $e_2$, a main focus is placed on the detection of the etching end point.

From this viewpoint, the flow rate $V_{e2}$ of the $SF_6$ gas in the small-amount supply step $e_2$ preferably is in a range of 15 sccm to 180 sccm. The flow rate $V_{e1}$ of the $SF_6$ gas at the large-amount supply step $e_1$ preferably is in a range of 200 sccm to 800 sccm, and to obtain a preferable etching rate, it more preferably is in a range of 400 sccm to 800 sccm.

The flow rate $V_{d1}$ of the $C_4F_8$ gas preferably is in a range of 100 sccm to 500 sccm.

The high frequency power $W_{c1}$ applied to the coil 16 preferably is in a range of 2000 W to 5000 W. Further, the high frequency power $W_{p1}$ applied to the platen 3 preferably is in a range of 20 W to 100 W, and $W_{p2}$ preferably is in a range of 10 W to 90 W.

Thus, in the embodiment, based on the detection principle described above, the etching end point is detected as described below.

That is, the light in the interior of the etching room 2a is received via the optical fiber 31 by the spectrometer 32, and an emission intensity according to each wavelength is detected.

The emission intensity data detected by the spectrometer 32 is successively transmitted to the end-point detecting processor 34, and a process shown in FIG. 2 is executed in the end-point detecting processor 34. As a result, the etching end point is detected.

More specifically, in the end-point detecting processor 34, a signal for starting the etching process is received from the programmable controller 21 to start the process, and a counter n is set to "1" (step S1). Thereafter, a signal related to the current processing is received from the programmable controller 21 (step 2). Whether the current step is the small-amount supply step $e_2$ capable of detecting the etching end point is confirmed, and when the current step is not the small-amount supply step $e_2$, processes following the step S2 are repeated to monitor the step (step S3).

On the other hand, when the confirmed current step is the small-amount supply step $e_2$, the emission intensity data received from the spectrometer 32 is analyzed to extract the emission intensity level of the wavelength which corresponds to SiF (step S4). The extracted emission intensity level and the reference value $T_1$ stored in the data storage section 35 are compared (step S5) to confirm whether the extracted emission intensity level is smaller than the reference value $T_1$ (step S5).

When the extracted emission intensity level is larger than the reference value $T_1$, the processes following the step S1 are repeated. On the other hand, when the extracted emission intensity level is smaller than the reference value $T_1$, the counter n is updated (step S6), and the processes following the step S2 are repeated. When the extracted emission intensity level falls below the reference value $T_1$ three times in succession (step S7), it is determined that the etching end point is reached, and the end-point detection signal is transmitted to the programmable controller 21 (step S8).

When the process is continued to be executed afterward, the processes following the step S1 are repeated. When the process is not continued, the process is ended (step S9).

The programmable controller 21 ends a series of etching processes after receiving the end-point detection signal from the end-point detecting processor 34.

As described above in detail, in the embodiment, the etching process is configured by the two steps, i.e., the large-amount supply step $e_1$ of supplying a large amount of $SF_6$ gas for processing the silicon substrate and the small-amount supply step $e_2$ of supplying a small amount of $SF_6$ gas for processing the silicon substrate. Thereby, at the large-amount supply step $e_1$, the high-speed etching in which the etching rate is increased can be realized; and in the small-amount supply step $e_2$, even though the etching rate is low, the etching end point can be surely detected. Therefore, the etching end point can be surely detected while realizing overall high-speed etching.

Unlike in the conventional art, in addition to the area for forming a device, an area for a plurality of etching end-point detecting patterns needs not be set on the silicon substrate S. Thus, the device integration can be increased and effective manufacturing can be enabled.

The sight window 2b for measuring the emission intensity may be arranged at an arbitrary position of the etching chamber 2, and therefore, there is a merit in that an equipment configuration is restricted minimally.

As described above, one embodiment of the present invention is described, and a specific mode in which the present invention can be implemented is not limited thereto.

In the embodiment described above, the emission intensity level of SiF is detected to detect the etching end point, for example. However, as described above, other SiFx species also have the same characteristics as those shown in FIG. 3. Therefore, when the emission intensity levels of the other SiFx species are detected, the etching end point may be detected according to the same procedure as that described above.

According to the knowledge by the present inventors, also Si generated in the plasma by the etching exhibits the same characteristic as that of the above-described SiFx. Therefore, the etching end point may be detected by detecting the emission intensity level of Si instead of that of SiFx. The reason for the same emission intensity characteristic of Si as that of SiFx is probably because the same mechanism responsible for SiFx is at work.

In this case also, the flow rate $V_{e2}$ of the $SF_6$ gas at the small-amount supply step $e_2$ preferably is in a range of 15 sccm to 180 sccm. The flow rate $V_{e1}$ of the $SF_6$ gas at the large-amount supply step $e_1$ preferably is in a range of 200 sccm to 800 sccm, and to obtain a preferable etching rate, it more preferably is in a range of 400 sccm to 800 sccm.

A substance generated in the plasma by the etching includes F as well. A relationship between an emission intensity of F and a supply amount of $SF_6$ gas has a characteristic as shown in FIGS. 5(a) to 5(f).

Figure 5:
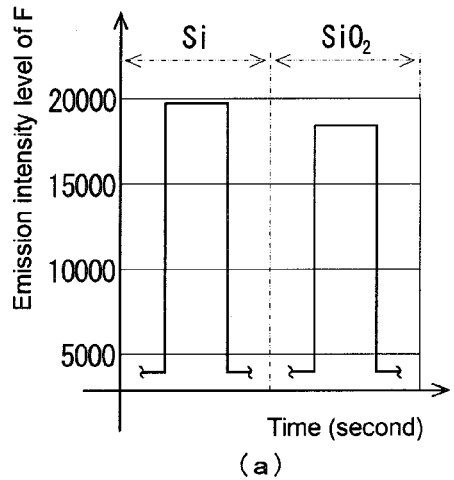
FIGS. 5(a) to 5(f) are explanatory diagrams each showing a characteristic related to an emission intensity of F when the lower layer film is the $SiO_2$ film.
Figure 5:
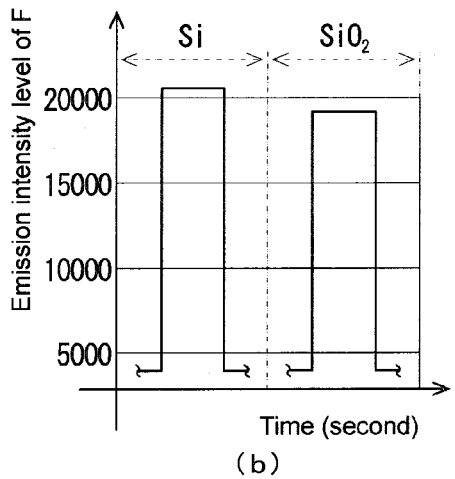
Figure 5:
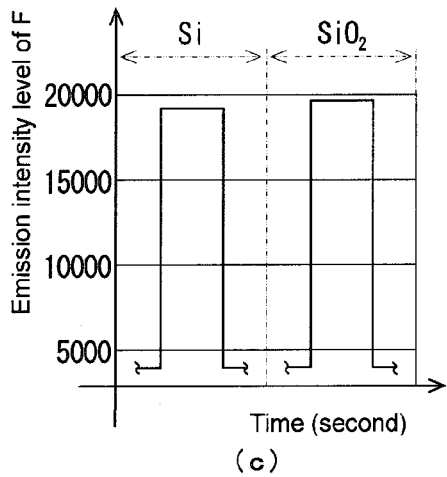
Figure 5:
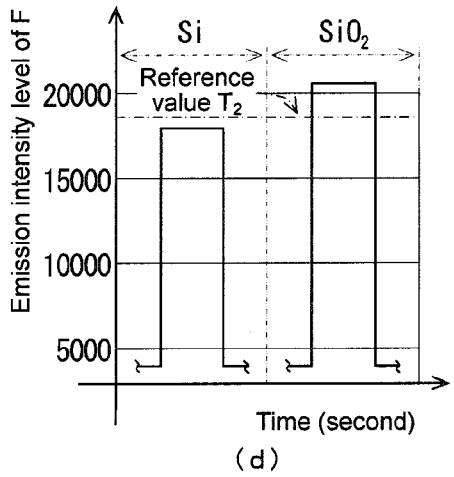
Figure 5:
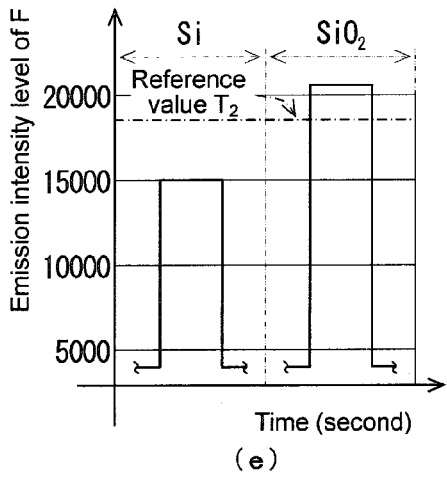
Figure 5:
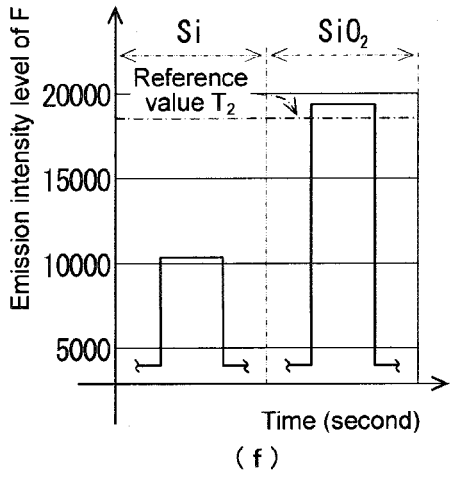

FIGS. 5(a) to 5(f) show emission intensities of F in the case where the Si film (only) exists under a plasma atmosphere and those in the case where the $SiO_2$ film (only) exists under the same condition. FIG. 5(a) shows an emission intensity of F in the case where a flow rate of the $SF_6$ gas is 800 sccm; FIG. 5(b) shows that in the case where a flow rate of the $SF_6$ gas is 400 sccm; FIG. 5(c) shows that in the case where a flow rate of the $SF_6$ gas is 200 sccm; FIG. 5(d) shows that in the case where a flow rate of the $SF_6$ gas is 180 sccm; FIG. 5(e) shows that in the case where a flow rate of the $SF_6$ gas is 100 sccm; and FIG. 5(f) shows that in the case where a flow rate of the $SF_6$ gas is 50 sccm.

As understood from FIGS. 5(a) to 5(f), when a large amount of $SF_6$ gas (200 sccm to 800 sccm) is supplied, there is not a large difference in emission intensity level of F between the case of the Si film and that of the $SiO_2$ film. However, when only a small amount of $SF_6$ gas (50 sccm to 180 sccm) is supplied, the emission intensity level in the case of the Si film is lower than that of the case of the $SiO_2$ film.

It is noted that in examples shown in FIGS. 5(a) to 5(f), a $Si/SiO_2$ ratio of the emission intensity level of F when the flow rate of the $SF_6$ gas was 180 sccm was about 0.9; a $Si/SiO_2$ ratio of the emission intensity level of F when the flow rate of the $SF_6$ gas was 100 sccm was about 0.7; and a $Si/SiO_2$ ratio of the emission intensity level of F when the flow rate of the $SF_6$ gas was 50 sccm was about 0.4. Although not particularly illustrated, a $Si/SiO_2$ ratio of the emission intensity level of F when the flow rate of the $SF_6$ gas was 30 sccm was about 0.2; and that when the flow rate of the $SF_6$ gas was 15 sccm was about 0.2, respectively.

The reason for such characteristics is probably because when there exists the Si film only, if a supply flow rate of the $SF_6$ gas is large, a ratio of $SiF_4$ which is an etch product, or Si or SiFx which is a dissociated species of $SiF_4$ is low, and if the supply flow rate of the $SF_6$ gas is small, the ratio of $SiF_4$ which is an etch product, or Si or SiFx which is a dissociated species of $SiF_4$ is high, and as a result, when the supply flow rate of the $SF_6$ gas is less, the ratio of F which exists in the interior of the etching room 2a becomes lower.

On the other hand, probably because when the $SiO_2$ film exists, the generated F is not spent for the etching or even when F is spent, an amount thereof is extremely small, and thus, an amount of F which exists in the interior of the etching room 2a does not change greatly.

Therefore, when the emission intensity of F in the plasma is measured in a state where a supply amount of $SF_6$ gas is small, whether the etching end point is reached can be detected. In this case, in the end-point detecting processor 34, the emission intensity data received from the spectrometer 32 is analyzed to extract the emission intensity level of a wavelength which corresponds to F at the step S4, the extracted emission intensity level is compared with a reference value $T_2$ stored in the data storage section 35 to confirm whether the extracted emission intensity level is larger than the reference value $T_2$ at the step S5, and when the extracted emission intensity level is larger than the reference value $T_2$, it is determined that the etching end point is reached.

Figure 7:
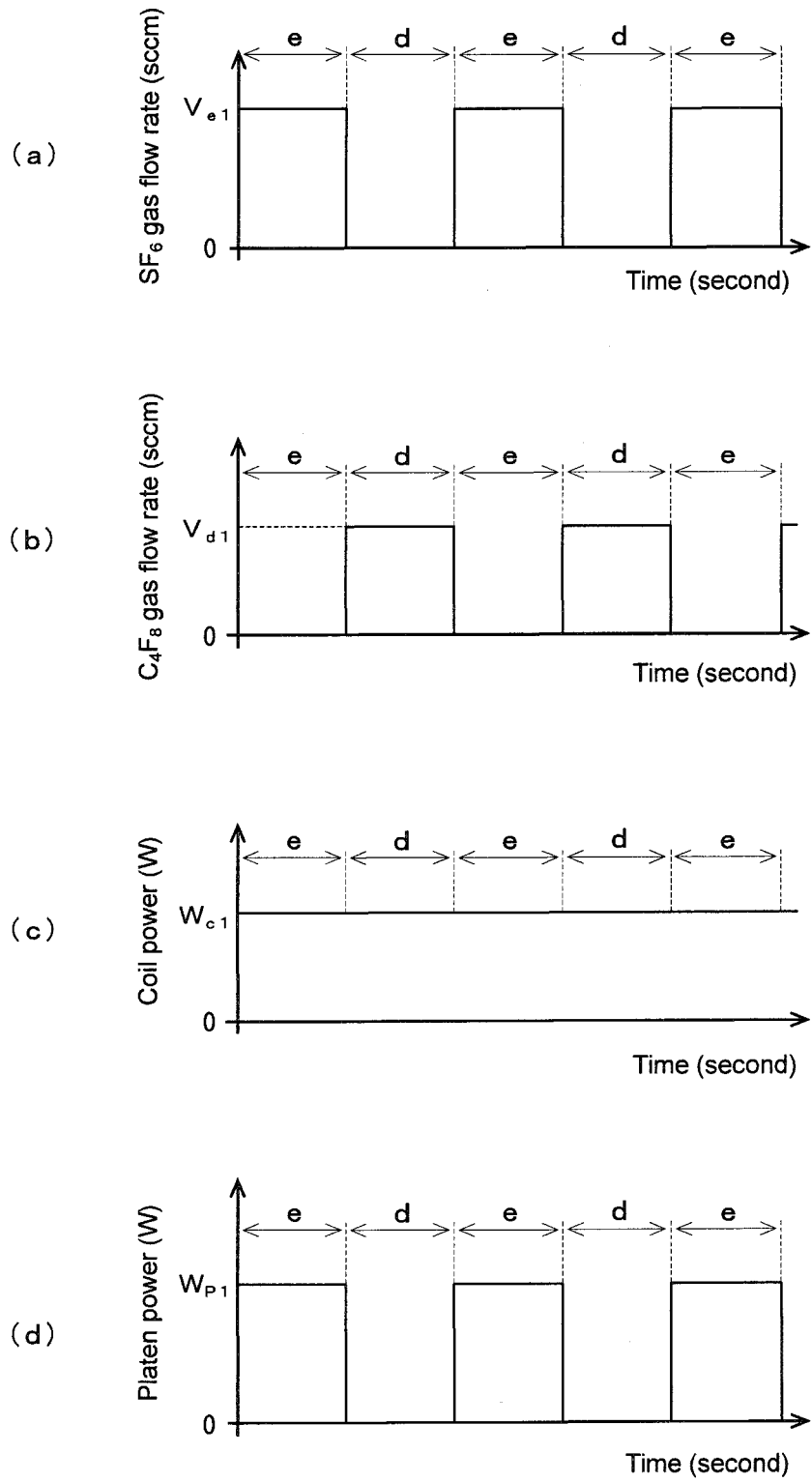
FIGS. 7(a) to 7(d) are timing charts showing: a control state of a flow rate of $SF_6$ gas; that of $C_4F_8$ gas; that of high frequency power applied to a coil; and that applied to a platen in another embodiment of the present invention.

From a start of the process, the above-described embodiment is implemented by dividing the etching process into the two steps, i.e., the large-amount supply step $e_1$ and the small-amount supply step $e_2$. However, the preset invention is not limited thereto. Therefore, under the control of the programmable control 21, the etching step comprised only of the large-amount supply step $e_1$ shown in FIG. 7 and the passivation-layer forming step may be repeated for a predetermined number of times until it is determined that the etching end point is within reach, and thereafter, the etching step comprised of the two steps, i.e., the large-amount supply step $e_1$ and the small-amount supply step $e_2$, described in FIG. 6, and the passivation-layer forming step may be repeatedly executed, thereby detecting the etching end point upon execution of the small-amount supply step $e_2$.

As described above, when supplying a large amount of $SF_6$ gas for processing the silicon substrate, the etching rate is high, and when the supply amount is small, the etching rate is low. Therefore, when the small-amount supply step is implemented from the start of the process, in viewpoint of the etching speed, it is not possible to say that this is always the most appropriate.

Therefore, as described above, when the etching step of supplying a large amount of $SF_6$ gas and the passivation-layer forming step are repeated for a predetermined number of times until it is determined that the etching end point is within reach, and thereafter, the etching step is implemented by dividing into the two steps, i.e., the large-amount supply step $e_1$ and the small-amount supply step $e_2$, it becomes possible to minimize a decrease of the etching speed by the small-amount supply step $e_2$, and possible to reliably detect the etching end point in a state where an overall etching speed is made faster, hence effective.

In the process procedure shown in FIG. 2, when the emission intensity of a substance to be monitored is equal to or less than a reference value (in the case of F, equal to or more than the reference value) three times in succession, it is determined that the etching end point is reached. However, the process procedure is not limited thereto. Therefore, when the emission intensity is equal to or less than the reference value (in the case of F, equal to or more than the reference value) at least once, or equal to or less than the reference value (in the case of F, equal to or more than the reference value) for a plurality of number of times in succession other than three times, it may be determined that the etching end point is reached.

In the above-described embodiment, the $SF_6$ gas only is supplied at the time of the etching step. However, this is not always the case. Besides the $SF_6$ gas, other gases such as $O_2$ gas, for example, may be supplied simultaneously.

In the above-described embodiment, there is shown an example in which in the plasma etching method in which the etching step and the passivation-layer forming step are repeated, the etching step is configured by the two steps, i.e., the large-amount supply step $e_1$ and the small-amount supply step $e_2$. However, an etching method to which the present invention can be applied is not limited thereto. The present invention may be applied to a plasma etching method in which the passivation-layer forming step is not provided, that is, etching steps are continuously implemented.

Figure 8:
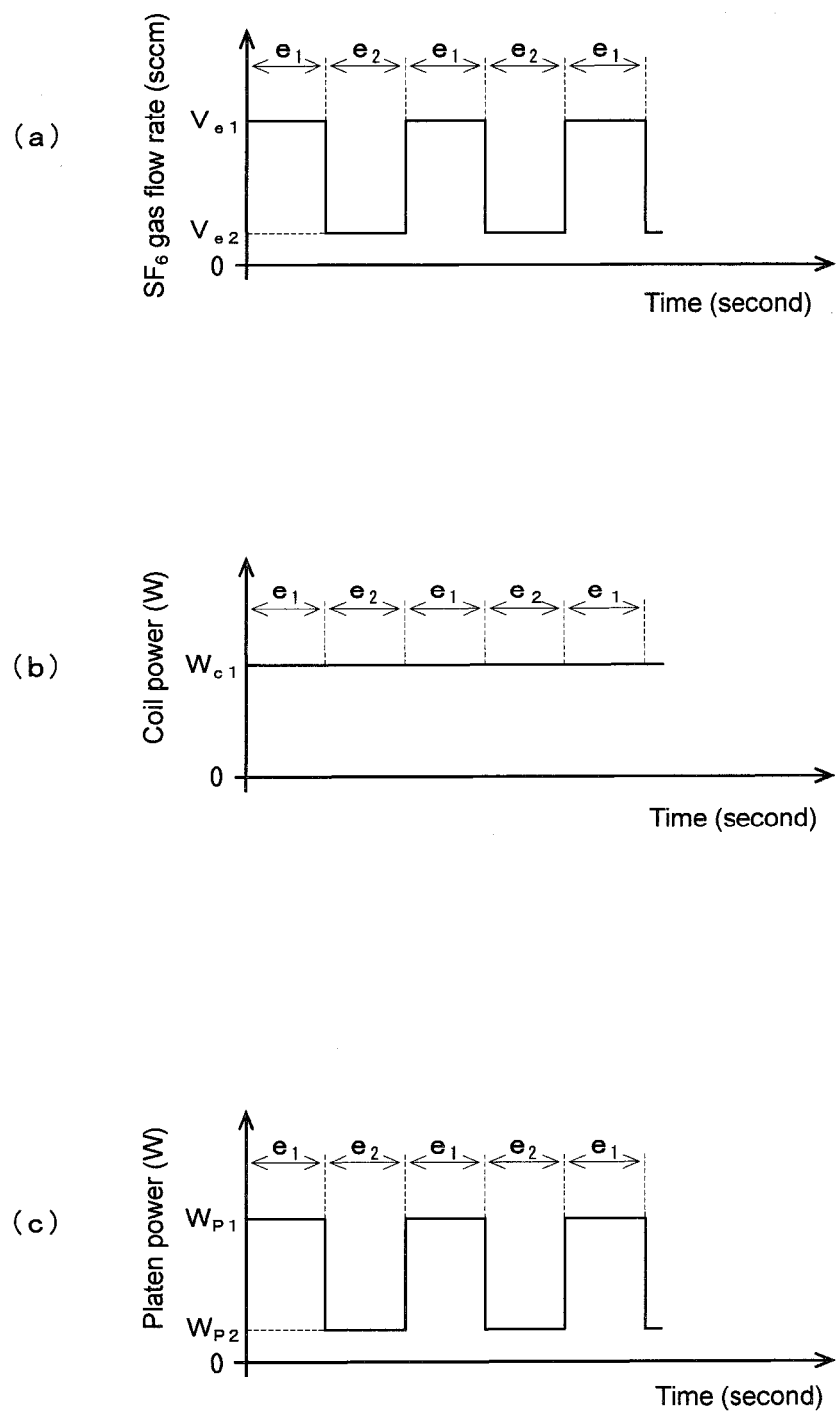
FIGS. 8(a) to 8(c) are timing charts showing: a control state of a flow rate of $SF_6$ gas; that of high frequency power applied to a coil; and that applied to a platen in still another embodiment of the present invention.

The plasma etching equipment 1 in that case is configured such that the gas cylinder 10 and the mass flow controller 12 are removed. The gas-flow-rate controller 22 controls the mass flow controller 11 such that the flow rate of $SF_6$ gas supplied in the interior of the etching room 2a from the gas cylinder 9 becomes that which is shown in FIG. 8(a). The coil power controller 23 controls the high-frequency power 17 such that the high-frequency power applied to the coil 16 becomes that which is shown in FIG. 8(b). The platen power controller 24 controls the high-frequency power source 18 such that the high-frequency power applied to the platen 3 becomes that which is shown in FIG. 8(c).

Thus, in this plasma etching method, the two steps, i.e., the large-amount supply step $e_1$ of supplying a large amount of $SF_6$ gas for processing the silicon substrate and the small-amount supply step $e_2$ of supplying a small amount of $SF_6$ gas for processing the silicon substrate, are repeatedly implemented. In the end-point detecting processor 34, the emission intensity of Si, SiFx, or F in the plasma in the small-amount supply step $e_2$ is detected. When the emission intensity of Si or SiFx is detected, if the intensity becomes equal to or less than the previously set reference value $T_1$, and when the emission intensity of F is detected, if the intensity becomes equal to or more than the previously set reference value $T_2$, the end-point detection signal is transmitted from the end-point detecting processor 34 to the programmable controller 21. The programmable controller 21 ends a series of etching processes after receiving the end-point detection signal from the end-point detecting processor 34.

In this case also, instead of repeatedly implementing from the start of the process the two steps, i.e., the large-amount supply step $e_1$ and the small-amount supply step $e_2$, the large-amount supply step $e_1$ is implemented for a previously determined period, and thereafter, the two steps, i.e., the large-amount supply step $e_1$ and the small-amount supply step $e_2$, may be repeatedly implemented from a point at which it is determined that the etching end point is within reach.

In each embodiment described above, the etching step is configured by the two steps, i.e., the large-amount supply step $e_1$ and the small-amount supply step $e_2$. However, another step may be included besides the two steps.

In the above-described embodiment, the silicon substrate S in which the Si film is formed on the $SiO_2$ film is used as one example. However, the silicon substrate S is not limited to that which is described above. For the lower layer film formed under the Si film, those such as a film formed by a polyimide tape, a film formed by photoresist, a film formed by grease, a film formed by wax, a film formed by a sheet with a thermal stripping material (a polyester film or the like), a silicon nitride film, or the like, may be included, for example. The lower layer film is not particularly limited as long as it is that which is more difficult to etch as compared to the Si film.

Figure 9:
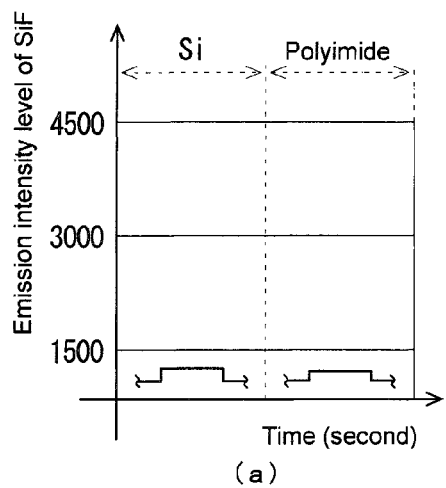
FIGS. 9(a) to 9(f) are explanatory diagrams each showing a characteristic related to an emission intensity of SiF when the lower layer film is formed of polyimide.
Figure 9:
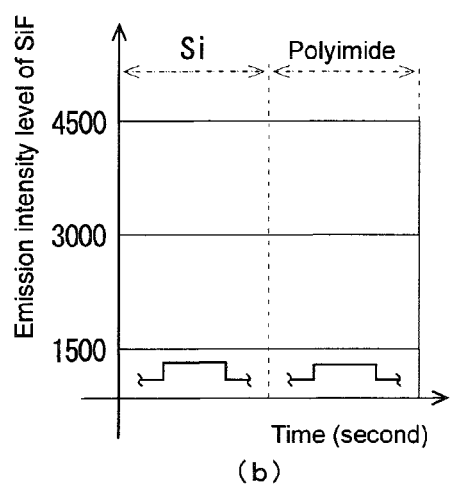
Figure 9:
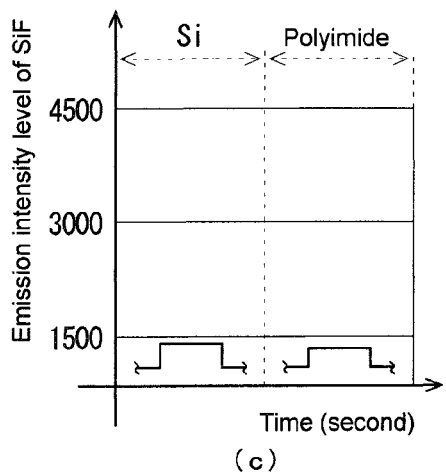
Figure 9:
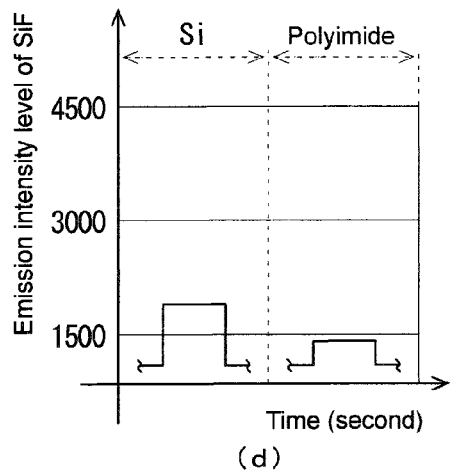
Figure 9:
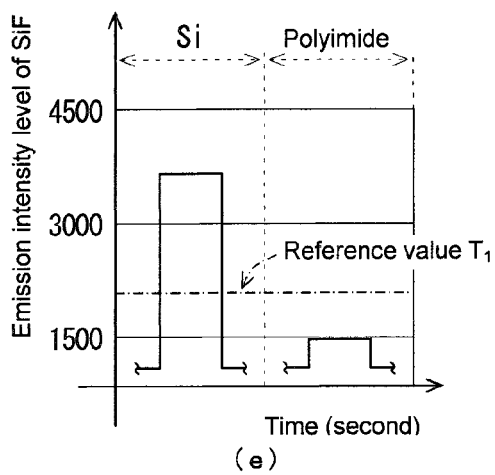
Figure 9:
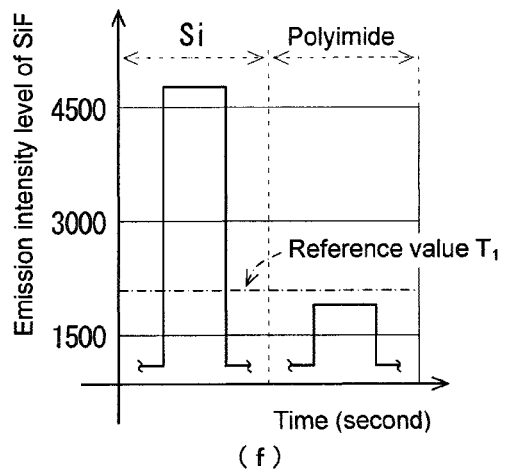

FIGS. 9(*a*) to 9(*f*) show emission intensities of SiF in the case where the Si film exists under a plasma atmosphere and those in the case where polyimide, as the lower layer film, exists under the same condition. FIG. 9(*a*) shows an emission intensity of SiF in the case where a flow rate of the $SF_6$ gas is 800 sccm; FIG. 9(*b*) shows that in the case where a flow rate of the $SF_6$ gas is 600 sccm; FIG. 9(*c*) shows that in the case where a flow rate of the $SF_6$ gas is 400 sccm; FIG. 9(*d*) shows that in the case where a flow rate of the $SF_6$ gas is 200 sccm; FIG. 9(*e*) shows that in the case where a flow rate of the $SF_6$ gas is 100 sccm; and FIG. 9(*f*) shows that in the case where a flow rate of the $SF_6$ gas is 50 sccm.

Figures 10, 11:
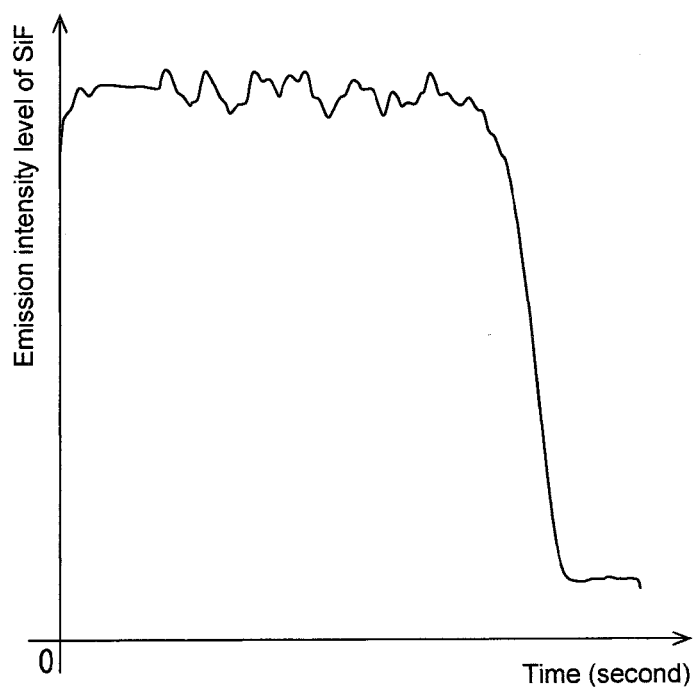
FIG. 10 is a table showing Si/polyimide ratios of an emission intensity level of SiF, Si/photoresist ratios thereof, and Si/polyester ratios thereof by each supply flow rate of $SF_6$ gas in the case where the lower layer film is formed of polyimide, photoresist, or polyester.
FIG. 11 is a graph showing a relationship between an emission intensity level of SiF and an etching time when $SF_6$ gas is supplied in low flow rate in the case where the lower layer film is formed of polyester.

FIG. 10 shows a Si/polyimide ratio, a Si/photoresist ratio, and a Si/polyester ratio of the emission intensity level of SiF in the case where the lower layer film is formed of polyimide, photoresist, and polyester by each supply flow rate of the $SF_6$ gas, respectively.

As is apparent from FIGS. 9(*a*) to 9(*f*) or FIG. 10, in the case where a large amount of $SF_6$ gas is supplied, there is not a large difference in emission intensity level of SiF between the case of the Si film and that of the polyimide, the photoresist, or the polyester. However, when only a small amount of $SF_6$ gas is supplied, the emission intensity level in the case of the Si film is much higher than that of the case of the polyimide, the photoresist, or the polyester. It is shown that a relationship between the emission intensity of SiF in the plasma and the supply amount of $SF_6$ gas changes similarly irrespective of the lower layer film.

Therefore, similar to the case where the lower layer film is the $SiO_2$ film, in a state where the supply amount of $SF_6$ gas is small, the emission intensity of SiF or Si in the plasma is measured and whether a value thereof is equal to or less than the previously determined reference value $T_1$ is determined. As a result, whether the etching end point is reached can be determined.

It is noted that FIG. 11 is a graph showing a relationship between the emission intensity level of the wavelength which corresponds to SiF and the etching time when the $SF_6$ gas at 50 sccm is supplied in the interior of the etching room 2*a* in the case where the lower layer film is formed of polyester. A certain time is elapsed after the start of the etching and the etching of the Si film is complete, and thus, the lower layer film is exposed. At this time, the emission intensity level is decreased. As is apparent from FIG. 11, when the emission intensity level is always monitored, the etching end point can be detected.

In this case also, the etching end point may be detected by detecting the emission intensity levels of other SiFx species instead of that of SiF or by detecting the emission intensity level of Si instead of that of SiFx. Similar to the above-described case, the flow rate $V_{e2}$ of $SF_6$ gas at the small-amount supply step $e_2$ preferably is in a range of 15 sccm to 180 sccm, and the flow rate $V_{e1}$ of $SF_6$ gas at the large-amount supply step $e_1$ preferably is in a range of 200 sccm to 800 sccm.

Figure 12:
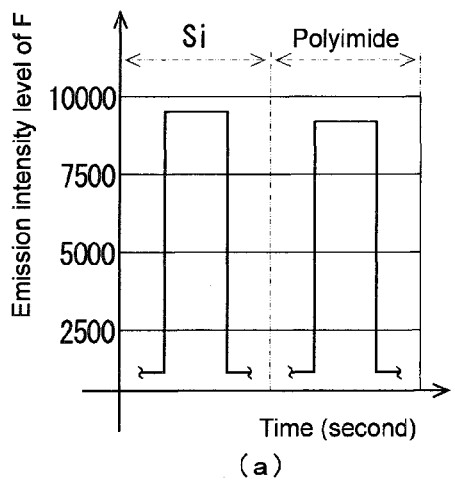
FIGS. 12(a) to 12(f) are explanatory diagrams each showing a characteristic related to an emission intensity of F when the lower layer film is formed of polyimide.
Figure 12:
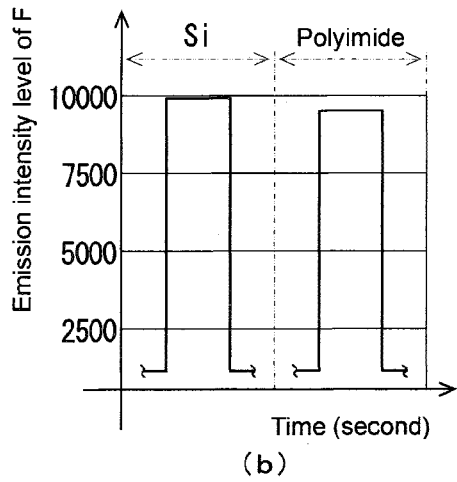
Figure 12:
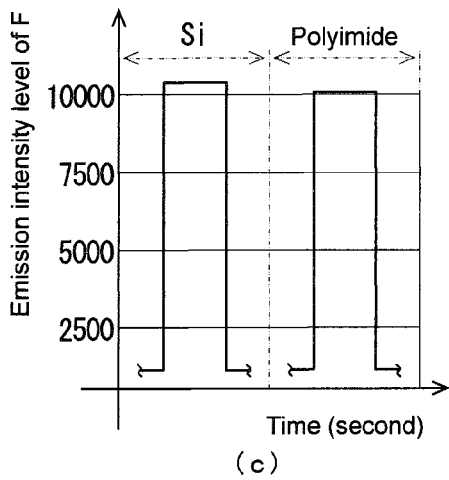
Figure 12:
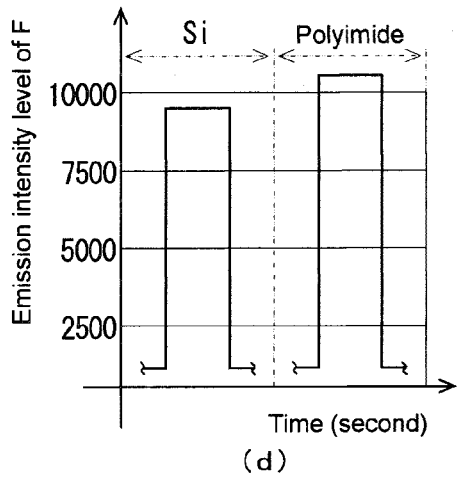
Figure 12:
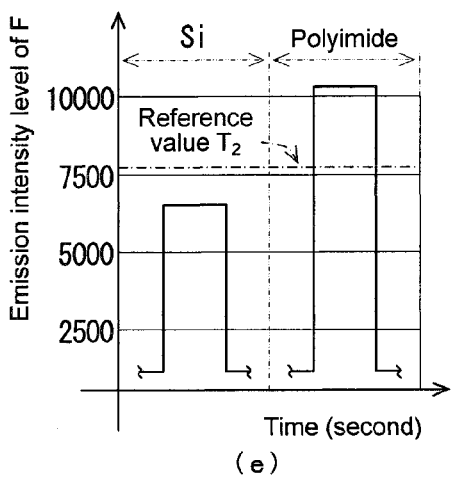
Figure 12:
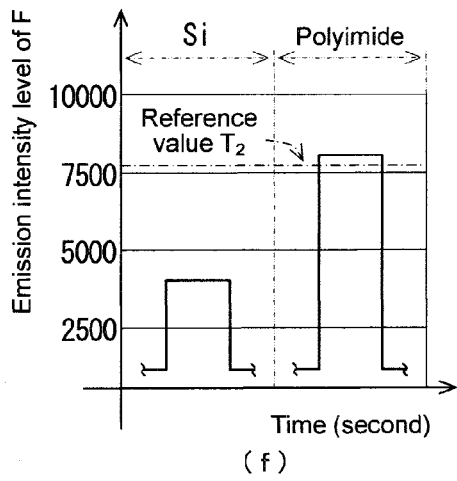

On the other hand, FIGS. 12(*a*) to 12(*f*) show emission intensities of F in the case where the Si film exists under a plasma atmosphere and those in the case where polyimide exists, as the lower layer film, under the same condition. FIG. 12(*a*) shows an emission intensity of F in the case where a flow rate of the $SF_6$ gas is 800 sccm; FIG. 12(*b*) shows that in the case where a flow rate of the $SF_6$ gas is 600 sccm; FIG. 12(*c*) shows that in the case where a flow rate of the $SF_6$ gas is 400 sccm; FIG. 12(*d*) shows that in the case where a flow rate of the $SF_6$ gas is 200 sccm; FIG. 12(*e*) shows that in the case where a flow rate of the $SF_6$ gas is 100 sccm; and FIG. 12(*f*) shows that in the case where a flow rate of the $SF_6$ gas is 50 sccm.

FIG. 13 shows a Si/polyimide ratio, a Si/photoresist ratio, and a Si/polyester ratio of the emission intensity level of F in the case where the lower layer film is formed of the polyimide, the photoresist, and the polyester by each supply flow rate of $SF_6$ gas, respectively.

As is apparent from FIGS. 12(*a*) to 12(*f*) or FIG. 13, in the case where a large amount of $SF_6$ gas is supplied, there is not a large difference in emission intensity level of F between the case of the Si film and that of the polyimide, the photoresist, or the polyester. However, in the case where only a small amount of $SF_6$ gas is supplied, the emission intensity level of the case of the Si film is lower as compared to the emission intensity level of the case of the polyimide, the photoresist, or the polyester. It is shown that a relationship between the emission intensity of F in the plasma and the supply amount of $SF_6$ gas changes similarly irrespective of the lower layer film.

Therefore, similar to the case where the lower layer film is the $SiO_2$ film, in a state where the supply amount of $SF_6$ gas is small, the emission intensity of F in the plasma is measured and whether a value thereof is larger than the previously determined reference value $T_2$ is determined. As a result, whether the etching end point is reached can be determined.

In this case also, similar to the above-described case, the flow rate $V_{e2}$ of $SF_6$ gas in the small-amount supply step $e_2$ preferably is in a range of 15 sccm to 180 sccm, and the flow rate $V_{e1}$ of $SF_6$ gas at the large-amount supply step $e_1$ preferably is in a range of 200 sccm to 800 sccm.

INDUSTRIAL APPLICABILITY

The plasma etching method and the plasma etching equipment according to the present invention are capable of surely detecting the etching end point, and are suitable as the plasma etching method and the plasma etching equipment capable of forming a structure of high form accuracy.

The invention claimed is:

1. A plasma etching method capable of detecting an end point in which a Si film of a silicon substrate including the Si film formed on a surface side and a lower layer film formed below the Si film is etched, the plasma etching method for etching the Si film by supplying etching gas containing $SF_6$ gas so that plasma is formed, wherein
  at least two steps of a large-amount supply step of supplying a large amount of $SF_6$ gas for performing high-speed etching on the silicon substrate and a small-amount supply step at which a supply amount is reduced to supply a small amount of $SF_6$ gas for performing low-speed etching on the silicon substrate are repeatedly implemented,
  at least an emission intensity of Si or fluorinated silicon in the plasma at the small-amount supply step is measured,
  only the emission intensity measured at the small-amount supply step is used to determine whether an etching end point where the lower layer film is exposed is reached, and
  when the emission intensity of Si or fluorinated silicon becomes equal to or less than a previously set reference value, a determination is made that the etching end point is reached, and a process is ended.

2. A plasma etching method capable of detecting an end point in which a Si film of a silicon substrate including the Si film formed on a surface side and a lower layer film formed below the Si film is etched, the plasma etching method for etching the Si film by supplying etching gas containing $SF_6$ gas so that plasma is formed, wherein
  at least two steps of a large-amount supply step of supplying a large amount of $SF_6$ gas for performing high-speed etching on the silicon substrate and a small-amount supply step at which a supply amount is reduced to supply a small amount of $SF_6$ gas for performing low-speed etching on the silicon substrate are repeatedly implemented,
  at least an emission intensity of F in the plasma at the small-amount supply step is measured,
  only the emission intensity measured at the small-amount supply step is used to determine whether an etching end point where the lower layer film is exposed is reached, and
  when the emission intensity of F becomes equal to or more than a previously set reference value, a determination is made that the etching end point is reached, and a process is ended.

3. A plasma etching method capable of detecting an end point in which a Si film of a silicon substrate including the Si film formed on a surface side and a lower layer film formed below the Si film is etched, the plasma etching method for etching the Si film by supplying etching gas containing $SF_6$ gas so that plasma is formed, wherein
  after a large-amount supply step of supplying a large amount of $SF_6$ gas for performing high-speed etching on the silicon substrate is implemented for a previously determined time, at least two steps of the large-amount supply step and a small-amount supply step at which a supply amount is reduced to supply a small amount of $SF_6$ gas for performing low-speed etching on the silicon substrate are repeatedly implemented,
  at least an emission intensity of Si or fluorinated silicon in the plasma at the small-amount supply step is measured,
  only the emission intensity measured at the small-amount supply step is used to determine whether an etching end point where the lower layer film is exposed is reached, and
  when the emission intensity of Si or fluorinated silicon becomes equal to or less than a previously set reference value, a determination is made that the etching end point is reached, and a process is ended.

4. A plasma etching method capable of detecting an end point in which a Si film of a silicon substrate including the Si film formed on a surface side and a lower layer film formed below the Si film is etched, the plasma etching method for etching the Si film by supplying etching gas containing $SF_6$ gas so that plasma is formed, wherein
  after a large-amount supply step of supplying a large amount of $SF_6$ gas for performing high-speed etching on the silicon substrate is implemented for a previously determined time, at least two steps of the large-amount supply step and a small-amount supply step at which a supply amount is reduced to supply a small amount of $SF_6$ gas for performing low-speed etching on the silicon substrate are repeatedly implemented,
  at least an emission intensity of F in the plasma at the small-amount supply step is measured,
  only the emission intensity measured at the small-amount supply step is used to determine whether an etching end point where the lower layer film is exposed is reached, and
  when the emission intensity of F becomes equal to or more than a previously set reference value, a determination is made that the etching end point is reached, and a process is ended.

5. A plasma etching method capable of detecting an end point in which a Si film of a silicon substrate including the Si film formed on a surface side and a lower layer film formed below the Si film is etched, the plasma etching method for etching the Si film by repeatedly implementing: an etching step of etching the Si film by supplying etching gas containing $SF_6$ gas so that plasma is formed; and a passivation-layer forming step of forming a passivation-layer on a structural surface formed at the etching step by supplying passivation-layer forming gas containing fluorocarbon gas or $O_2$ gas so that plasma is formed, wherein
  the etching step is configured by at least two steps of: a large-amount supply step of supplying a large amount of $SF_6$ gas for performing high-speed etching on the silicon substrate; and a small-amount supply step at which a supply amount is reduced to supply a small amount of $SF_6$ gas for performing low-speed etching on the silicon substrate,
  at least an emission intensity of Si or fluorinated silicon in the plasma at the small-amount supply step is measured,
  only the emission intensity measured at the small-amount supply step is used to determine whether an etching end point where the lower layer film is exposed is reached, and
  when the emission intensity of Si or SiFx becomes equal to or less than a previously set reference value, a determination is made that the etching end point is reached, and a process is ended.

6. A plasma etching method capable of detecting an end point in which a Si film of a silicon substrate including the Si film formed on a surface side and a lower layer film formed below the Si film is etched, the plasma etching method for etching the Si film by repeatedly implementing: an etching step of etching the Si film by supplying etching gas containing $SF_6$ gas so that plasma is formed; and a passivation-layer forming step of forming a passivation-layer on a structural surface formed at the etching step by supplying passivation-layer forming gas containing fluorocarbon gas or $O_2$ gas so that plasma is formed, wherein
  the etching step is configured by at least two steps of: a large-amount supply step of supplying a large amount of $SF_6$ gas for performing high-speed etching on the silicon substrate; and a small-amount supply step at which a supply amount is reduced to supply a small amount of $SF_6$ gas for performing low-speed etching on the silicon substrate, at least an emission intensity of F in the plasma at the small-amount supply step is measured, only the emission intensity measured at the small-amount supply step is used to determine whether an etching end point where the lower layer film is exposed is reached, and when the emission intensity of F becomes equal to or more than a previously set reference value, a determination is made that the etching end point is reached, and a process is ended.

7. A plasma etching method capable of detecting an end point in which a Si film of a silicon substrate including the Si film formed on a surface side and a lower layer film formed below the Si film is etched, the plasma etching method for etching the Si film by repeatedly implementing: an etching step of etching the Si film by supplying etching gas containing $SF_6$ gas so that plasma is formed and a passivation-layer forming step of forming a passivation-layer on a structural surface formed at the etching step by supplying passivation-layer forming gas containing fluorocarbon gas or $O_2$ gas so that plasma is formed, wherein the etching step and the passivation-layer forming step are repeatedly implemented for a previously determined number of times, and thereafter, the etching step is implemented by dividing into at least two steps of: a large-amount supply step of supplying a large amount of $SF_6$ gas for performing high-speed etching on the silicon substrate; and a small-amount supply step at which a supply amount is reduced to supply a small amount of $SF_6$ gas for performing low-speed etching on the silicon substrate, at least an emission intensity of Si or fluorinated silicon in the plasma at the small-amount supply step is measured, only the emission intensity measured at the small-amount supply step is used to determine whether an etching end point where the lower layer film is exposed is reached, and when the emission intensity of Si or fluorinated silicon becomes equal to or less than a previously set reference value, a determination is made that the etching end point is reached, a process is ended.

8. A plasma etching method capable of detecting an end point in which a Si film of a silicon substrate including the Si film formed on a surface side and a lower layer film formed below the Si film is etched, the plasma etching method for etching the Si film by repeatedly implementing: an etching step of etching the Si film by supplying etching gas containing $SF_6$ gas so that plasma is formed; and a passivation-layer forming step of forming a passivation-layer on a structural surface formed at the etching step by supplying passivation-layer forming gas containing fluorocarbon gas or $O_2$ gas so that plasma is formed, wherein the etching step and the passivation-layer forming step are repeatedly implemented for a previously determined number of times, and thereafter, the etching step is implemented by dividing into at least two steps of: a large-supply amount step of supplying a large amount of $SF_6$ gas for performing high-speed etching on the silicon substrate; and a small-amount supply step at which a supply amount is reduced to supply a small amount of $SF_6$ gas for performing low-speed etching on the silicon substrate, at least an emission intensity of F in the plasma at the small-amount supply step is measured, only the emission intensity measured at the small-amount supply step is used to determine whether an etching end point where the lower layer film is exposed is reached, and when the emission intensity of F becomes equal to or more than a previously set reference value, a determination is made that the etching end point is reached, and a process is ended.

9. The plasma etching method capable of detecting an end point according to any one of claims 1 to 8, wherein at the large-amount supply step, $SF_6$ gas of 200 sccm or more is supplied, and at the small-amount supply step, $SF_6$ gas of 180 sccm or less is supplied.

* * * * *